United States Patent
Ohkubo (10) Patent No.: US 6,781,617 B2
(45) Date of Patent: Aug. 24, 2004

(54) EXPOSURE APPARATUS

(75) Inventor: Kazunobu Ohkubo, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/318,388

(22) Filed: Dec. 13, 2002

(65) Prior Publication Data

US 2003/0146969 A1 Aug. 7, 2003

(30) Foreign Application Priority Data

Dec. 13, 2001 (JP) .......................................... 2001-380449

(51) Int. Cl.[7] ............................ B41J 2/447; B41J 2/465
(52) U.S. Cl. ....................................................... 347/238
(58) Field of Search ................................ 347/233, 238, 347/247

(56) References Cited

U.S. PATENT DOCUMENTS 6,292,209 B1 * 9/2001 Nakamura et al. .......... 347/238
6,538,682 B2 * 3/2003 Ohkubo ....................... 347/238
2001/0052926 A1 * 12/2001 Hori ............................ 347/238

* cited by examiner

*Primary Examiner*—Huan Tran
(74) *Attorney, Agent, or Firm*—Sughrue Mion, PLLC (57) ABSTRACT

A plurality of cathode lines are formed as scanning electrodes on a transparent substrate, and metal cathodes of the same cathode line apply a common potential to organic electroluminescence elements that are arranged in a main-scanning direction in the same element row. A plurality of anode lines are formed as data electrodes on the transparent substrate, so as to intersect the plurality of cathode lines and incline at a predetermined angle θ with respect to a sub-scanning direction. Transparent anodes of the same anode line apply a common potential to organic electroluminescence elements having mutually different positions in the sub-scanning direction. Organic electroluminescence elements that use the same anode line have mutually different positions in the main-scanning direction. Organic electroluminescence elements that have the same position in the main-scanning direction use mutually different anode lines.

19 Claims, 8 Drawing Sheets

EXPOSURE APPARATUS

BACKGROUND OF THE INVENTION

1. Field of the Invention

The present invention relates to an exposure apparatus, particularly relates to the exposure apparatus in which a plurality of scanning electrodes of a line shape of a direction corresponding to a main-scanning direction are provided in a sub-scanning direction, and a plurality of data electrodes of a direction corresponding to the sub-scanning direction are provided in the main-scanning direction, and a light emitting element which emits light by receiving voltage application of the scanning electrode and the data electrode is formed at an intersecting position of the scanning electrode and the data electrode.

2. Description of the Related Art

There hitherto has been the exposure apparatus in which the light emitting elements are arranged in the main-scanning direction, for the exposure apparatus which exposes a photosensitive member to record a picture image. In the exposure apparatus, unevenness in the shape of a streak in the sub-scanning direction is generated on the picture image by variations in light emitting quantity of each element. Therefore, there is a technique which averages the variations in the light emitting quantity of each element to eliminate the unevenness in the shape of the streak in a manner that arranges a plurality of element rows in the sub-scanning direction and repeatedly exposes one main-scanning line by the plurality of element rows.

In this case, one of a pair of electrodes (an anode and a cathode) which applies a predetermined voltage (or current) to the light emitting element to emit light is provided in each element row, the plurality of light emitting elements which constitutes the element row and are arranged in the main-scanning direction are used as the common scanning electrode, the other electrode is provided so as to intersect the plurality of scanning electrodes which are provided in each element row, and the plurality of light emitting elements which are arranged between the plurality of element rows in the sub-scanning direction are sometimes used as the common data electrode.

However, in the related art, because the voltage is applied by the same data electrode in the plurality of light emitting elements which exposes the same pixel element and are arranged in the sub-scanning direction, in case that the variations in characteristics of the data electrodes or a driving voltage from a driver are caused in each data electrode, even if each light emitting element is formed uniformly, there has been a problem that the unevenness in the shape of the streak is generated in the sub-scanning direction. Though it is also considered that quantity of light or print density in each pixel element is measured, and the driving voltage (or current) value in each element, exposure time, or the like is adjusted in each element to suppress the variations in exposure, it is not feasible due to a necessity of a complicated control system.

SUMMARY OF THE INVENTION

In view of the foregoing, it is an object of the present invention to provide an exposure apparatus which can decrease the unevenness in the shape of the streak of the sub-scanning direction which is caused by the variations in the characteristics of the data electrode or the driver and be feasible with a simple arrangement.

In order to achieve the above-described object, an exposure apparatus according to the invention in which a plurality of scanning electrodes of a line shape of a direction corresponding to a main-scanning direction are provided in a sub-scanning direction, a plurality of data electrodes of a direction corresponding to the sub-scanning direction are provided in the main-scanning direction, and a light emitting element which emits light by receiving voltage application of the scanning electrode and the data electrode is formed at an intersecting position of the scanning electrode and the data electrode, which is characterized in that each of the plurality of data electrodes is provided to have a predetermined angle to the sub-scanning direction so that exposure positions where exposure is carried out by the light emitting elements formed in the different data electrodes become substantially the same position in the sub-scanning.

An exposure apparatus according to the invention comprises a plurality of scanning electrodes which are arranged in a direction corresponding to a sub-scanning direction and formed in the shape of a line in a direction corresponding to a main-scanning direction and a plurality of data electrodes which is provided so as to intersect the plurality of scanning electrodes, and a light emitting element which emits light by receiving voltage application of the scanning electrode and the data electrode is formed at an intersecting point of the scanning electrode and the data electrode. In more detail, by providing each of the plurality of data electrodes to have a predetermined angle to the sub-scanning direction such that exposure positions where exposure is carried out by the light emitting elements formed in the different data electrodes become substantially the same position in the sub-scanning, when the sub-scanning is carried out in the exposure, since the same pixel element is exposed repeatedly (multiple exposure) by the light emitting elements formed in the different data electrodes, even if variations in the characteristics of the data electrode or a driving voltage from the driver in each data electrode are generated, an influence of the variations is averaged and the unevenness in the shape of the streak in the sub-scanning direction can be decreased. The exposure apparatus can be realized only by obliquely arranging the data electrode relative to the sub-scanning direction, and a complicated control system is not required.

In the exposure apparatus, the scanning electrode may be provided to form a predetermined angle to the main-scanning direction.

In the exposure apparatus, an organic electroluminescence element, an inorganic electroluminescence element, or a liquid crystal element having a light emitting function can be used as the light emitting element.

DETAILED DESCRIPTION OF THE PREFERRED EMBODIMENTS

An embodiment according to the present invention will be described below in detail with reference to drawings.

First Embodiment

Figure 1:
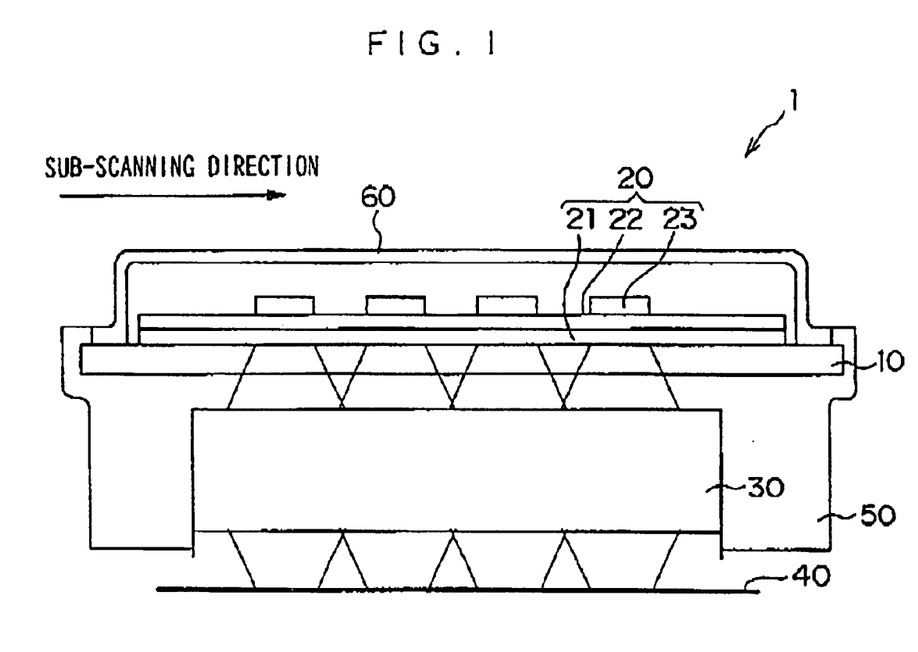
FIG. 1 is a sectional view showing a construction of an exposure apparatus of a first embodiment of the present invention.

As shown in FIG. 1, an exposure apparatus 1 according to a first embodiment of the invention includes a transparent substrate 10, an organic electroluminescence element 20 formed on the transparent substrate 10 by vapor deposition, a SELFOC lens array (hereinafter referred to as "SLA") 30 which condenses light emitted by the organic electroluminescence element 20 to irradiate the light to a photosensitive member 40, and a support member 50 supporting the transparent substrate 10 or the SLA 30.

The organic electroluminescence element 20 is formed to laminate a transparent anode 21, an organic compound layer 22 including a luminous layer, and a metal cathode 23 in order on the transparent substrate 10 by the vapor deposition. The organic electroluminescence element 20 is covered with a sealing member 60 such as a stainless steel shown in FIG. 1. An edge portion of the sealing member 60 and the organic electroluminescence element 20 are adhered, the transparent substrate 10 is sealed within the sealing member 60 which is replaced by dry nitrogen gas. When a predetermined voltage is applied between the transparent anode 21 and the metal cathode 23 of the organic electroluminescence element 20, the luminous layer included in the organic compound layer 22 emits light, the emission light is radiated through the transparent anode 21 and the transparent substrate 10. The organic electroluminescence element 20 is superior in wavelength stability.

It is preferable that the transparent anode 21 has light transmittance of at least 50 percent, preferably 70 percent in a wavelength range of a visible light from 400 nm to 700 nm. A compound which is known as a transparent electrode material such as tin oxide, indium tin oxide (ITO), and indium zinc oxide as well as a thin film which includes a metal having a large work function such as gold or silver may be used as a material for constituting the transparent anode 21. An organic compound such as polyaniline, polythiophene, polypyrrole, and these derivatives may be also used as the material for constituting the transparent anode 21. The transparent electrically conductive film is described in "Toumei Douden-maku no Shin-tenkai" supervised by SAWADA, Yutaka (published by CMC publishing Co., Ltd., 1999) in detail, which is applied for the invention. The transparent anode 21 can be formed on the transparent substrate 10 by a vacuum evaporation method, a sputtering method, an ion plating method, and the like.

The organic compound layer 22 may be not only a single structure including only the luminous layer, but also a laminated structure which properly has other layers such as a hole injection layer, a hole transport layer, an electron injection layer, and an electron transport layer as well as the luminous layer. Anode/hole injection layer/hole transport layer/luminous layer/electron transport layer/cathode, anode/luminous layer/electron transport layer/cathode, anode/hole transport layer/luminous layer/electron transport layer/cathode, and the like may be cited as a specific structure (including electrodes) of the organic compound layer 22. A plurality of luminous layers, hole transport layers, hole injection layers, or electron injection layers may be provided.

It is preferable that the metal cathode 23 is made of a metal material having the low work function such as alkali metal containing Li, K, and the like, alkali earth metal such as Mg, Ca, and the like, and alloys and mixtures which contain these metals and Ag, Al or the like. In order that preservation stability is consistent with electron injection property in the cathode, the electrode formed by the above-described material may be further coated by Ag, Al, Au, and the like which have the large work function and high electrical conductivity. In the same way as the transparent anode 21, the metal cathode 23 can be also formed on the transparent substrate 10 by the known method such as the vacuum evaporation method, the sputtering method, the ion plating method.

The SLA 30 includes a plurality of SELFOC lenses. The SELFOC lens has a refractive index profile of a radial direction in section and is the thick lens in the shape of a rod. Light which has been incident into the SELFOC lens meanders in the shape of a sine wave to an optical axis, the light is outputted to the photosensitive member 40 so as to form image on a surface of the photosensitive member 40 to make an exposure spot 70.

Figure 2:
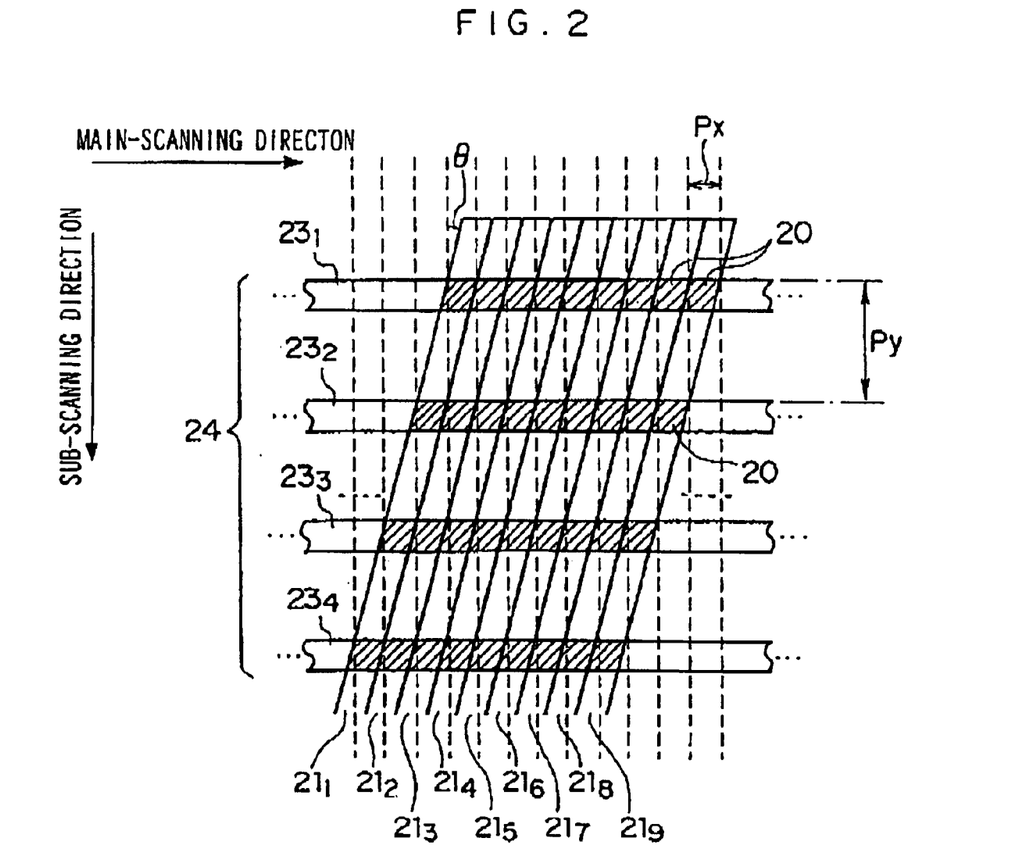
FIG. 2 is a plan view schematically showing an arrangement of an organic electroluminescence element and an electrode in the exposure apparatus of the first embodiment of the invention.

An arrangement of the transparent anode and the metal cathode will next be described. As shown in FIG. 2, a group of element rows 24 is formed on the transparent substrate 10 by arranging a plurality of element rows in which a plurality of organic electroluminescence elements 20 are arranged in a main-scanning direction in a sub-scanning direction while the element rows are separated from each other by a predetermined distance.

Each of the metal cathodes 23 is formed to be a common electrode for the plurality of organic electroluminescence elements 20 arranged in the main-scanning direction in each elements row. According to an arrangement layout of the organic electroluminescence element, a plurality of cathode lines $23_l$ to $23_m$ formed in the shape of a line in the main-scanning direction are formed on the transparent substrate 10 while the plurality of cathode lines $23_l$ to $23_m$ are separated from each other by a predetermined distance in the sub-scanning direction. On the other hand, each of the transparent anodes 21 is formed to be a common electrode for the plurality of organic electroluminescence elements 20 whose positions are different in the sub-scanning direction. According to the arrangement layout of the organic electroluminescence element, a plurality of anode lines $21_l$ to $21_n$ are formed on the transparent substrate 10 so as to intersect the plurality of cathode lines $23_l$ to $23_m$ while the anode lines $21_l$ to $21_n$ are separated from each other by a predetermined distance.

In the embodiment, there is used the case that the metal cathode 23 and the transparent anode 21 are formed so that each of cathode lines $23_l$ to $23_m$ and each of anode lines $21_l$ to $21_n$ correspond to a scanning electrode and a data electrode respectively, however, reversely the anode line and the cathode line may be formed as the scanning electrode and the data electrode respectively.

When the voltage is applied between the anode lines $21_l$ to $21_n$ and the cathode lines $23_l$ to $23_m$, in parts where the anode lines $21_l$ to $21_n$ and the cathode lines $23_l$ to $23_m$ are intersected, light emission is occurred from the luminous layer included in the laminated organic compound layer 22, and the light-emitting light is radiated from the transparent substrate 10 side.

In more detail, the anode lines $21_l$ to $21_n$ is formed obliquely so as to make a predetermined angle θ to the sub-scanning direction, the organic electroluminescence elements 20 having the same anode line in common differ from each other in the position of the main-scanning direction between the cathode lines $23_l$ to $23_m$, the positions of the main-scanning direction become substantially the same in case of the organic electroluminescence elements 20 utilizing the anode lines different from each other. That is to say, during the sub-scanning, exposure positions of the organic electroluminescence elements 20 utilizing the anode lines different from each other become substantially the same. The anode lines $21_l$ to $21_n$ are provided to correspond in one-to-one to each pixel element constituting one main-scanning line, the one main-scanning line is exposed with no space by each element row including the organic electroluminescence element 20 utilizing each of the cathode lines $23_l$ to $23_m$ in common.

In the exposure apparatus 1 of the above-described arrangement, the emission light of the organic electroluminescence element 20 is condensed by the SLA 30 to be irradiated to the photosensitive member 40, while the one main-scanning line is exposed by the element row including the organic electroluminescence elements 20 having the same cathode line in common, the exposure apparatus 1 is relatively moved in the sub-scanning direction with respect to the photosensitive member 40, and multiple exposures are carried out by the element row having the different main-scanning line. At this point, with reference to each pixel element in the main-scanning line, the multiple exposures are carried out by the organic electroluminescence elements 20 utilizing the anode line different from each other in a manner that provides the anode lines $21_l$ to $21_n$ obliquely relative to the sub-scanning direction.

As described above, since the one main-scanning line is multiple-exposed by the plurality of element row utilizing the different cathode lines, an influence of variations in every organic electroluminescence element 20 can be decreased, and since the same pixel element is exposed by the organic electroluminescence elements 20 utilizing the anode line different from each other in the multiple exposure, the unevenness in the shape of the streak of the sub-scanning direction which is caused by variations in the characteristics of the anode line (data electrode) or the driver can be reduced. Furthermore, the multiple exposures can be carried out only by obliquely arranging the anode line (data electrode) by the predetermined angle θ with respect to the sub-scanning direction, so that the complicated control system is not also required.

Figure 3:
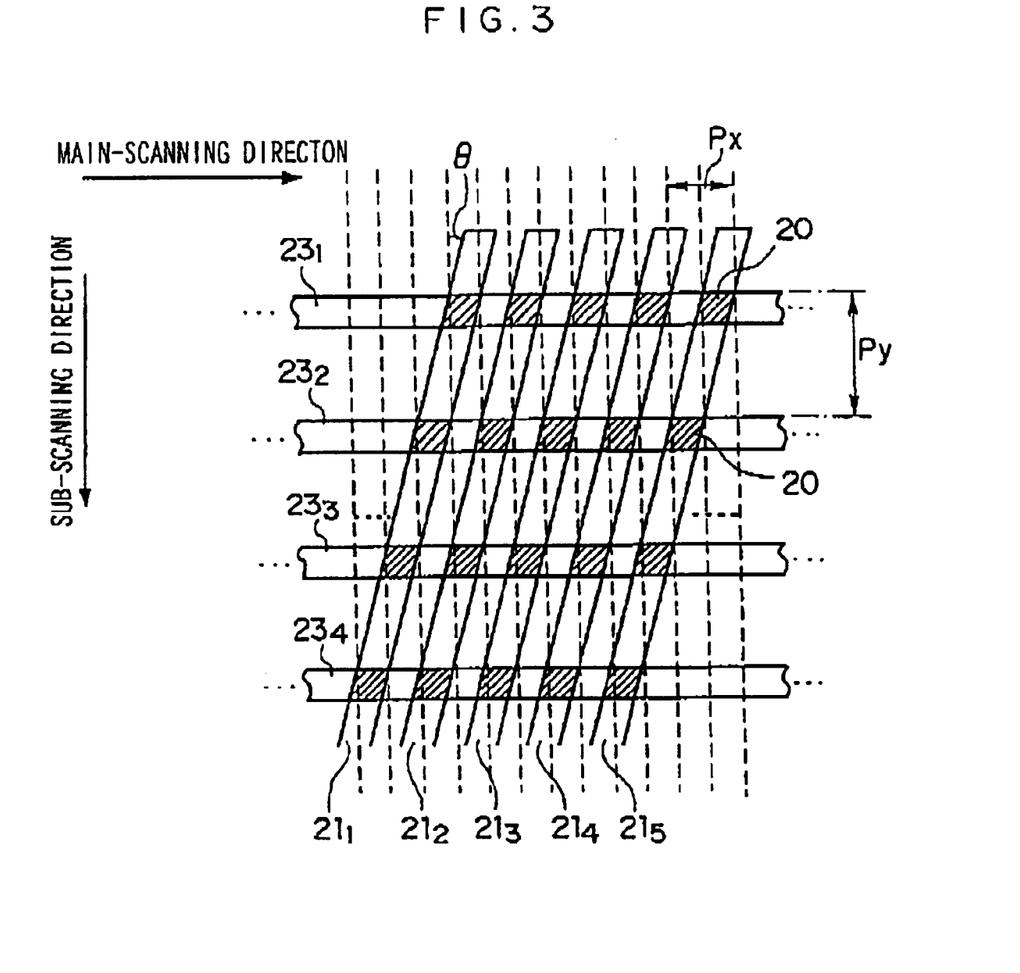
FIG. 3 is a plan view schematically showing another arrangement of the organic electroluminescence element and the electrode in the exposure apparatus of the first embodiment of the invention.

In the embodiment, it is essential that, by providing the anode lines $21_l$ to $21_n$ obliquely relative to the sub-scanning direction, the plurality of organic electroluminescence elements 20 utilizing the cathode lines $23_l$ to $23_m$ different from each other and the anode lines $23_l$ to $23_m$ different from each other are arranged at the same position in the main-scanning direction, so that the invention is not limited to the above-described specific arrangement. In the specific arrangement described above, there is described the case that the anode lines $21_l$ to $21_n$ are provided to correspond in one-to-one to each pixel element constituting the one main-scanning line, however, the invention is not limited to the case. As shown in FIG. 3, for example, by using the element row in which the distance between the anode lines provided obliquely by the certain angle θ with respect to the sub-scanning direction is formed to be two times that of FIG. 2, the one anode line is provided every two pixel element and the organic electroluminescence elements 20 utilizing the cathode lines $23_{2k-1}$ (k: an integral number of at least one) construct the element row, which fills an opening between exposure spots formed by the element rows including the organic electroluminescence elements 20 utilizing the cathode lines $23_{2k}$, the exposure may be also carried out with no space in a manner that complements the one main-scanning line by the two element rows. In this case, the same pixel element is multiple-exposed by the element row using the cathode lines $23_{2k-1}$ and the cathode lines $23_{2k-1}$, and the same Pixel element is multiple-exposed by the element row using the cathode lines $23_{2k}$ and the cathode lines $23_{2k+2}$, needless to say, in each cathode line, the anode lines of the plurality of organic electroluminescence elements multiple-exposing the same pixel element are different respectively.

In case that the anode line is provided every certain pixel element, the oblique angle θ to the sub-scanning direction of the anode line may be set properly according to the arrangement layout of the organic electroluminescence element 20. In case that the anode line is provided every j-pixel element (j: an integral number of at least one) and the exposure is carried out without leaving a space in a manner that complements the one main-scanning line by the plurality of element rows, the oblique angle θ is set to satisfy tan θ=px/(j×py), where px is an arrangement pitch of the main-scanning direction of the organic electroluminescence element 20 (corresponding to the arrangement pitch of the anode line) and py is the arrangement pitch of the sub-scanning direction (corresponding to the arrangement pitch of the cathode line).

It is not always necessary that the arrangement pitch px of the main-scanning direction of the organic electroluminescence element is an integral multiple of a dimension in the main-scanning direction of the organic electroluminescence element, provided an extent giving no influence on picture quality, parts of each exposure spot may be overlapped or there may be some space between the exposure spots, while the exposure is carried out in a manner that complements the one main-scanning line by the different element rows. The arrangement pitch py of the sub-scanning direction of the organic electroluminescence element can be set arbitrarily, since image resolution of the sub-scanning direction is adjustable by movement quantity in case that the exposure apparatus is relatively moved with respect to the photosensitive member in the sub-scanning direction.

Figure 4:
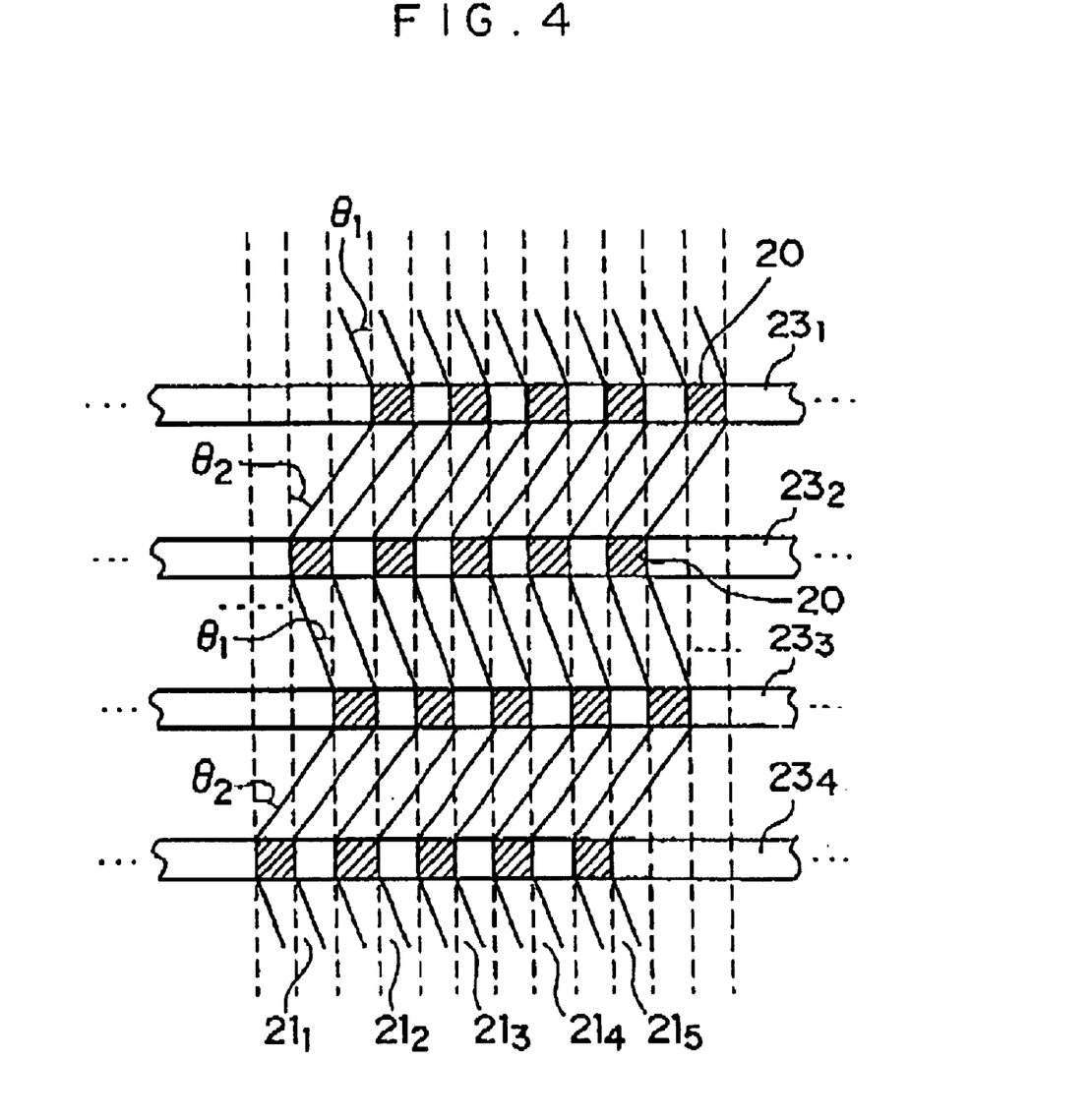
FIG. 4 is a plan view schematically showing still another arrangement of the organic electroluminescence element and the electrode in the exposure apparatus of the first embodiment of the invention.

In the embodiment, there is described the case that the anode lines $21_l$ to $21_n$ are provided to set constantly the oblique angle θ with respect to the sub-scanning direction over the cathode lines $23_l$ to $23_m$, however, the invention is not limited to the case. For example, as shown in FIG. 4, the anode lines $21_l$ to $21_n$ may be arranged to be zigzag so that an oblique direction to the sub-scanning direction of the anode lines $21_l$ to $21_n$ is changed every time when the anode lines $21_l$ to $21_n$ intersect the cathode line and the arrangement which is oblique by $θ_1$ or $θ_2$ to the sub-scanning direction is repeated.

Second Embodiment

A second embodiment of the invention will be described below. In the following description, the same numerals and signs are given to the same portion as the first embodiment, and the repeated description is abbreviated.

Figure 5:
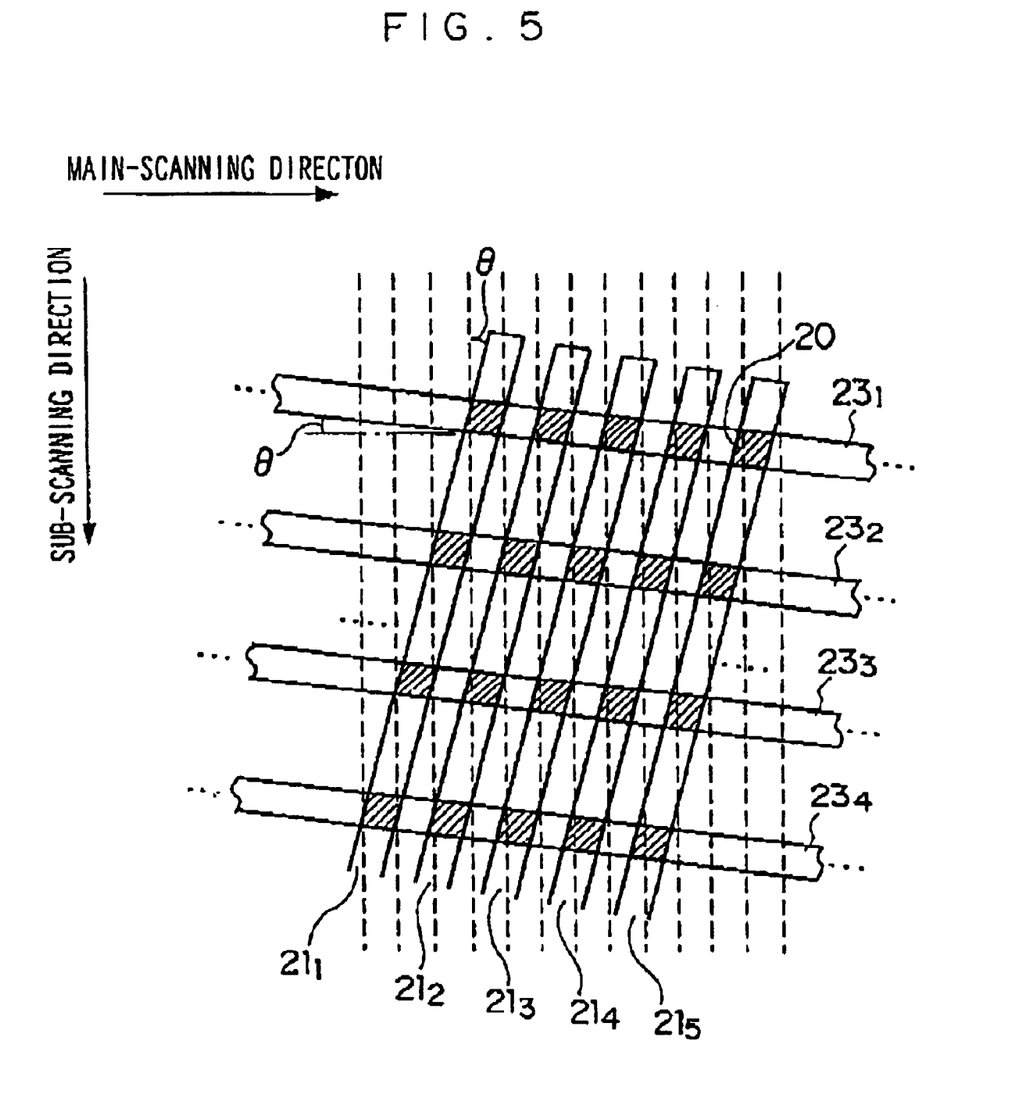
FIG. 5 is a plan view schematically showing an arrangement of an organic electroluminescence element and an electrode in an exposure apparatus of a second embodiment of the invention.

As shown in FIG. 5, an exposure apparatus according to the second embodiment is obliquely formed so as to make the cathode lines $23_l$ to $23_m$ at the predetermined angle θ to the main-scanning direction in the exposure apparatus described in the first embodiment. The exposure apparatus of this kind, for example, can be arranged by rotating the whole of the cathode lines and the anode lines by the predetermined angle θ so that the anode lines $21_l$ to $21_n$ of the data electrode are formed to cross the cathode lines $23_l$ to $23_m$ of the scanning electrode at right angles and the anode line is formed obliquely at the predetermined angle θ to the sub-scanning direction. In FIG. 5, though the case that the one anode line is arranged every two pixel elements while the anode lines $21_l$ to $21_n$ are separate from each other is shown as an example, the anode line may be provided in one-to-one to each pixel element constituting the one main-scanning line.

In the above-described arrangement, in the same manner as the first embodiment, the one main-scanning line is multiple-exposed by the plurality of element row utilizing the different cathode lines, so that the influence of the variations of every organic electroluminescence element can be decreased, and the same pixel element is exposed by the organic electroluminescence elements utilizing the different anode lines in the multiple exposure, so that the unevenness in the shape of the streak of the sub-scanning direction, which is caused by the variations in the characteristics of the anode line (data electrode) or the driver, can be decreased.

Figure 6:
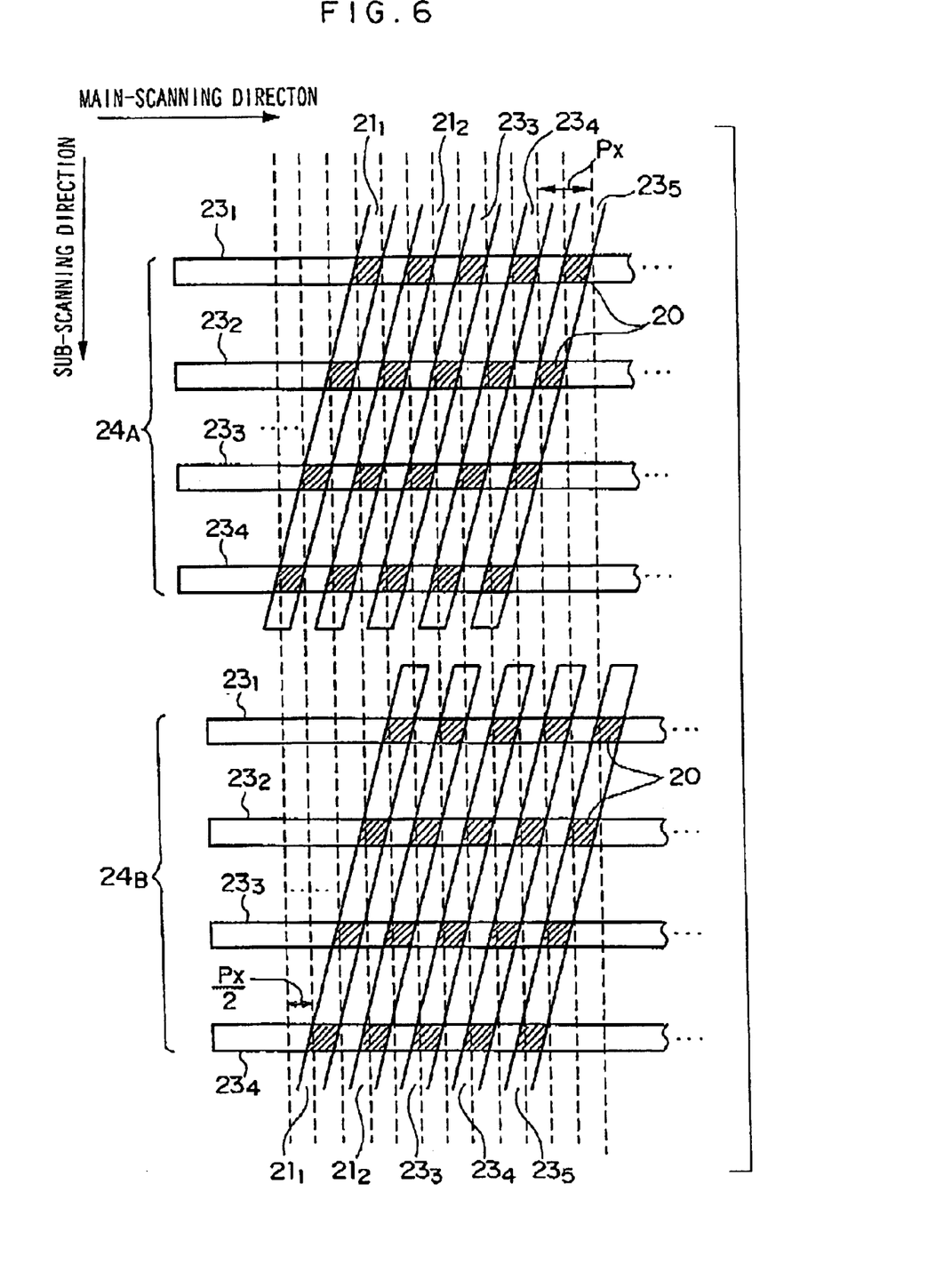
FIG. 6 is a plan view schematically showing an example of an arrangement of an organic electroluminescence element and an electrode in case that an exposure apparatus has a plurality of groups of element rows in the exposure apparatus according to another embodiment of the invention.

In the first and second embodiments, though the exposure apparatus having only the one group of element rows is shown as the example, the exposure apparatus may have the plurality of groups of element rows. For example, as shown in FIG. 6, in case that two groups of element rows 24A and 25B are arranged to dislocate them by px/2 in the main-scanning direction, like the above-described embodiments, the same pixel element is multiple-exposed in each group of element rows, and spaces between the exposure spots of the group of element rows 24A can be exposed so as to be filled by the group of element rows 24B, which allows the image of the higher resolution to be formed.

Figure 7:
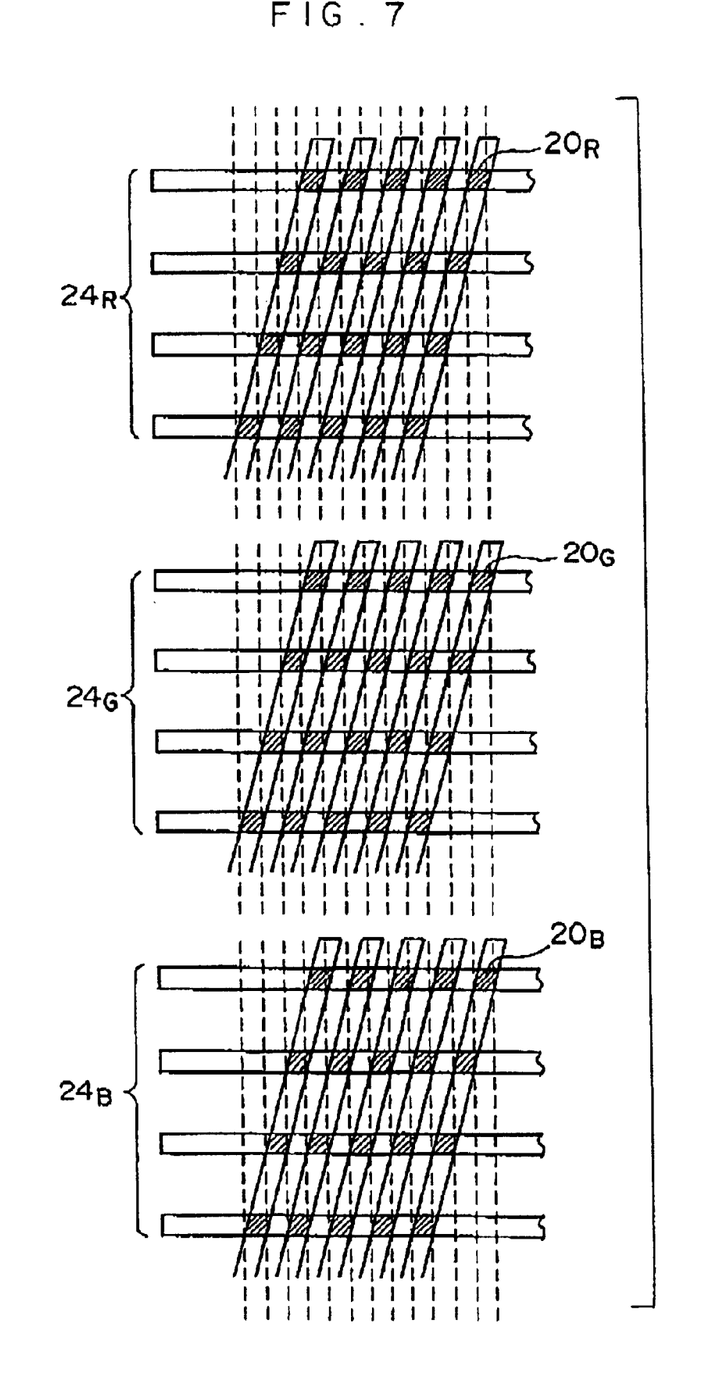
FIG. 7 is a plan view schematically showing another example of an arrangement of an organic electroluminescence element and an electrode in case that an exposure apparatus has a plurality of groups of element rows in the exposure apparatus according to another embodiment of the invention.

The first and second embodiments have been described on the presume of the case that utilizes only one kind of the organic electroluminescence element 20 outputting the emission light of the same color, however, the plurality of kinds of the organic electroluminescence element outputting the plurality of emission lights may be used. For example, as shown in FIG. 7, in case that a group of element rows 24R including the organic electroluminescence element 20R outputting the emission light of red (R), a group of element rows 24G including the organic electroluminescence element 20G outputting the emission light of green (G), and a group of element rows 24B including the organic electroluminescence element 20B outputting the emission light of blue (B) are formed on the same transparent substrate, the color picture image can be formed. The organic electroluminescence element which outputs the emission light of a color (or a wavelength) except RGB may be used.

Figure 8A:
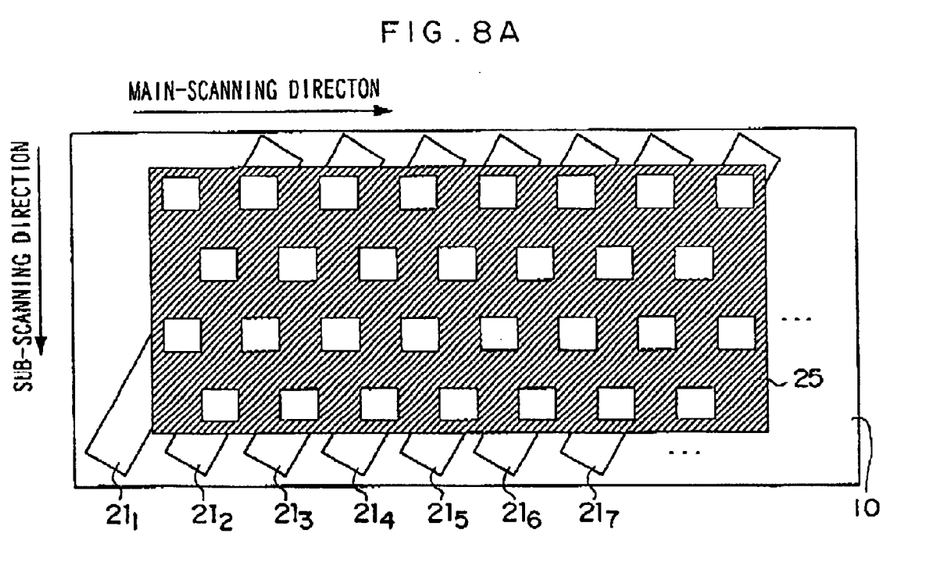
FIG. 8A is a top view showing a transparent substrate in case that each organic electroluminescence element is formed in a desired shape (rectangle shape) by disposing an insulating layer between a transparent anode and an organic compound layer in an exposure apparatus of the invention.
Figure 8B:
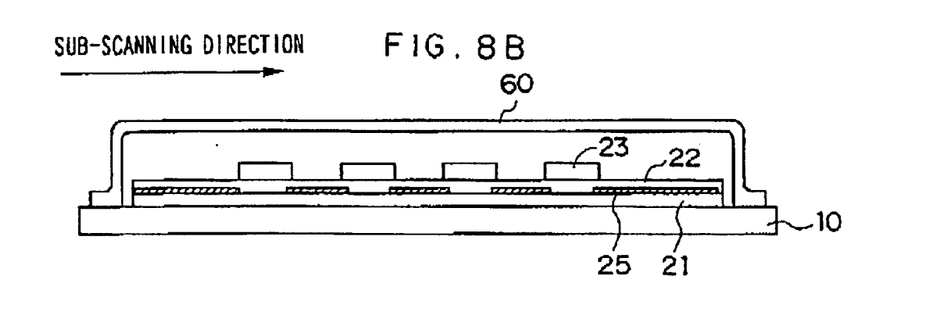
FIG. 8B is a sectional view of an exposure apparatus of the invention which has a transparent substrate in which each organic electroluminescence element is formed in a desired shape (rectangle shape) by disposing an insulating layer between a transparent anode and an organic compound layer.
Figure 9:
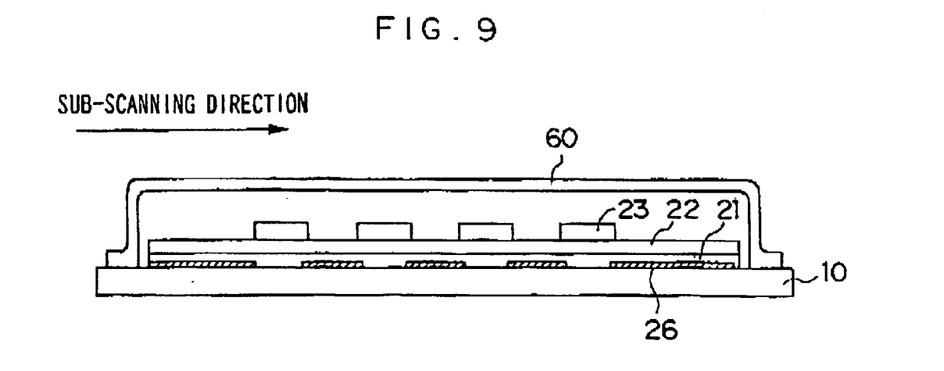
FIG. 9 is a sectional view of an exposure apparatus having a transparent substrate in which each organic electroluminescence element is formed in a desired shape (rectangle shape) by disposing a shading layer between a transparent substrate and a transparent anode.

In the first and second embodiments, the shape of a light emitting portion of the organic electroluminescence element 20 is determined by the shape of an intersecting area of the cathode line and the anode line, the shape of the exposure spot also depends on the shape of the intersecting area. However, as shown in FIGS. 8A and 8B, an insulating layer 25 is provided between the transparent anode 21 and the organic compound layer 22 by forming a thin film made of a material having an electrically insulating characteristic such as silicon dioxide, patterning of the insulating layer 25 is carried out by photolithography to form an opening of the desired shape such as a square, the shape of the light emitting portion of the organic electroluminescence element 20 is formed to be the desired shape, and the shape of the exposure spot may be controlled. The insulating layer 25 may be provided between the organic compound layer 22 and the metal cathode 23. As shown in FIG. 9, the same effect can be also obtained by a shading layer 26 made of metal such as Al, Au, and Cr or a material having a function shading the light, which is formed between the transparent substrate 10 and the transparent anode 21 by a method such as the use of a mask having the opening of the desired shape. The shading layer 26 may be provided between the transparent anode 21 and the organic compound layer 22 or the organic compound layer 22 and the metal cathode 23, or on a surface of the transparent substrate 10 opposite to a surface where the organic electroluminescence element is formed. In case that the shading layer 26 is formed, the shape of the shading layer 26 may be desirable by the use of the mask having the opening of the desirable shape and the like.

In the first and second embodiments, the case that the organic electroluminescence element is used as the light emitting element was described as the example, an inorganic electroluminescence element may be used. Furthermore, the invention is easily applicable to an exposure apparatus utilizing a liquid crystal element which has light emitting function as a light emitting element.

What is claimed is:

1. An exposure apparatus comprising;
    a plurality of line-shaped scanning electrodes which are arranged in a sub-scanning direction and control scanning in a main-scanning direction;
    a plurality of line-shaped data electrodes which are arranged in the main-scanning direction and control scanning in the sub-scanning direction; and
    a plurality of light emitting elements, each of which is formed at an intersection of one of the plurality of scanning electrodes and one of the plurality of data electrodes and emit light by receiving a voltage applied by one of the plurality of scanning electrodes and one of the plurality of data electrodes,
    wherein each of the plurality of data electrodes is arranged at a predetermined angle with respect to the sub-scanning direction so that light emitting elements formed along different data electrodes expose substantially the same position on an exposure subject in the sub-scanning direction.

2. An exposure apparatus according to claim 1, wherein each of the plurality of scanning electrodes is arranged at another predetermined angle with respect to the main-scanning direction.

3. An exposure apparatus according to claim 1, wherein the light emitting elements comprise one of organic electroluminescence elements, inorganic electroluminescence elements, or liquid crystal elements having a light emitting function.

4. An exposure apparatus according to claim 2, wherein the light emitting elements comprise one of organic electroluminescence elements, inorganic electroluminescence elements, or liquid crystal elements having a light emitting function.

5. An exposure apparatus comprising:
a transparent substrate;
a plurality of organic electroluminescence elements formed on the transparent substrate;
a plurality of metal cathodes controlling scanning in a main-scanning direction;
a plurality of transparent anodes controlling scanning in a sub-scanning direction;
a SELFOC lens array which condenses light emitted by the plurality of organic electroluminescence elements to irradiate a photosensitive member; and
a support member for supporting the transparent substrate and the SELFOC lens array, wherein
each of the plurality of organic electroluminescence elements is formed on the transparent substrate such that one of the transparent anodes, an organic compound layer including a light emitting layer, and one of the metal cathodes are laminated by sequential vapor deposition, and
when a voltage is applied to the one of the transparent anodes and the one of the metal cathodes, the corresponding organic electroluminescence element emits light, and the emitted light is radiated through the transparent anode and the transparent substrate.

6. An exposure apparatus according to claim 5, wherein the plurality of organic electroluminescence elements are arranged on the transparent substrate so as to constitute a group of element rows, the organic electroluminescence elements being arranged substantially in the main-scanning direction within each row, and the element rows being arranged so as to be separated from each other by a predetermined distance substantially in the sub-scanning direction.

7. An exposure apparatus according to claim 6, further comprising:
a plurality of cathode lines arranged so as to be separated from each other by a predetermined distance substantially in the sub-scanning direction and formed in lines substantially in the main-scanning direction corresponding to the arrangement of the organic electroluminescence elements on the transparent substrate, such that metal cathodes of the same cathode line apply a common potential to organic electroluminescence elements of the same element row; and
a plurality of anode lines formed so as to be separated from each other by a predetermined distance substantially in the main-scanning direction and intersecting the plurality of cathode lines corresponding to the arrangement layout of the organic electroluminescence elements on the transparent substrate, such that transparent anodes of the same anode line apply a common potential, to organic electroluminescence elements having different positions in the sub-scanning direction.

8. An exposure apparatus according to claim 7, wherein:
the plurality of anode lines are obliquely formed at a predetermined angle $\theta$ with respect to the sub-scanning direction;
organic electroluminescence elements that have the same anode line in common have different positions from each other with respect to the main-scanning direction; and
organic electroluminescence elements that have substantially the same position with respect to the main-scanning direction use different anode lines from one another.

9. An exposure apparatus according to claim 8, wherein the angle $\theta$ is set to satisfy $\tan \theta = px/(j \times py)$, j being an integer of one or greater, px being an arrangement pitch of the plurality of anode lines, and py being an arrangement pitch of the plurality of cathode lines.

10. An exposure apparatus according to claim 7, wherein the plurality of anode lines are arranged so as to obliquely zigzag at a first angle $\theta_1$ and a second angle $\theta_2$ in alternation, with respect to the sub-scanning direction.

11. An exposure apparatus according to claim 7, wherein the plurality of cathode lines are obliquely formed at a predetermined angle $\theta'$ with respect to the main-scanning direction.

12. An exposure apparatus according to claim 8, wherein the plurality of cathode lines are obliquely formed at a predetermined angle $\theta'$ with respect to the main-scanning direction.

13. An exposure apparatus according to claim 9, wherein the plurality of cathode lines are obliquely formed at a predetermined angle $\theta'$ with respect to the main-scanning direction.

14. An exposure apparatus according to claim 5, further comprising an electrically insulating layer formed between the organic compound layer, which constitutes the plurality of organic electroluminescence elements, and the transparent anodes.

15. An exposure apparatus according to claim 5, further comprising an electrically insulating layer formed between the organic compound layer, which constitutes the plurality of organic electroluminescence elements, and the metal cathodes.

16. An exposure apparatus according to claim 14, wherein the electrically insulating layer comprises silicon dioxide.

17. An exposure apparatus according to claim 15, wherein the electrically insulating layer comprises silicon dioxide.

18. An exposure apparatus according to claim 5, further comprising a shading layer formed between the organic compound layer, which constitutes the plurality of organic electroluminescence elements, and the transparent anodes, the shading layer having formed therein an opening of a predetermined shape.

19. An exposure apparatus according to claim 5, further comprising a shading layer formed between the organic compound layer, which constitutes the plurality of organic electroluminescence elements, and the metal cathodes, the shading layer having formed therein an opening of a predetermined shape.

* * * * *